United States Patent
Fujita et al.

(10) Patent No.: US 9,526,194 B2
(45) Date of Patent: Dec. 20, 2016

(54) POWER CONVERSION DEVICE WITH FLOW CONDUITS FOR COOLANT

(71) Applicant: Hitachi Automotive Systems, Ltd., Hitachinaka-shi, Ibaraki (JP)

(72) Inventors: Yuki Fujita, Hitachinaka (JP); Kenichiro Nakajima, Hitachinaka (JP); Kaname Sasaki, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/433,169

(22) PCT Filed: Oct. 2, 2013

(86) PCT No.: PCT/JP2013/076758
§ 371 (c)(1),
(2) Date: Apr. 2, 2015

(87) PCT Pub. No.: WO2014/061447
PCT Pub. Date: Apr. 24, 2014

(65) Prior Publication Data
US 2015/0245535 A1    Aug. 27, 2015

(30) Foreign Application Priority Data
Oct. 15, 2012 (JP) ................. 2012-227598

(51) Int. Cl.
  *H05K 7/20* (2006.01)
  *H02M 7/00* (2006.01)
  *H01H 9/52* (2006.01)

(52) U.S. Cl.
  CPC ......... *H05K 7/20927* (2013.01); *H02M 7/003* (2013.01); *H05K 7/2089* (2013.01); *H01H 9/52* (2013.01)

(58) Field of Classification Search
CPC ............. H05K 7/2089; H05K 7/20927; H05K 7/20936; H05K 7/20845; H05K 7/20872–7/20881; H05K 7/20218; H05K 7/20254; H05K 7/1432; H01L 23/473; H01H 9/52
(Continued)

(56) References Cited

U.S. PATENT DOCUMENTS 6,765,285 B2 *   7/2004   Shinohara ............. H01L 23/473
                                                 257/678
7,667,953 B2 *   2/2010   Uzawa ................... H01G 9/035
                                                 252/62.2
(Continued)

FOREIGN PATENT DOCUMENTS

EP    1 713 169 A1    10/2006
JP    2003-322082 A   11/2003
(Continued)

OTHER PUBLICATIONS

International Search Report (PCT/ISA/210) dated Dec. 10, 2013, with English translation (two (2) pages).
(Continued)

*Primary Examiner* — Zachary M Pape
(74) *Attorney, Agent, or Firm* — Crowell & Moring LLP

(57) ABSTRACT

A power conversion device includes a power semiconductor module that converts DC current into AC current, a capacitor for smoothing DC power, a first flow conduit defining member for defining a first flow conduit and for defining a first storage space in which the power semiconductor module is housed, and a second flow conduit defining member for defining a second flow conduit and for defining a second storage space in which the capacitor is housed. A first space, in which a vehicle component that is different from the power conversion device is disposed, is defined in a space to
(Continued)

the side of the first flow conduit defining member and below the second flow conduit defining member.

11 Claims, 14 Drawing Sheets

(58) Field of Classification Search
USPC .............. 361/699, 701–703; 165/80.4–80.5, 165/104.33; 257/714; 174/547; 363/141
See application file for complete search history.

(56) References Cited

U.S. PATENT DOCUMENTS

| | | | |
|---|---|---|---|
| 7,978,471 B2* | 7/2011 | Tokuyama | H01L 23/36 165/104.33 |
| 9,058,932 B2* | 6/2015 | Ebersberger | H01G 2/08 |
| 2003/0200761 A1* | 10/2003 | Funahashi | F01C 21/10 62/228.4 |
| 2005/0223727 A1 | 10/2005 | Funahashi et al. | |
| 2006/0064998 A1 | 3/2006 | Funahashi et al. | |
| 2013/0021749 A1 | 1/2013 | Nakajima | |
| 2013/0094269 A1 | 4/2013 | Maeda et al. | |
| 2013/0294040 A1* | 11/2013 | Fukumasu | H02M 1/44 361/752 |

FOREIGN PATENT DOCUMENTS

| | | |
|---|---|---|
| JP | 2004-128099 A | 4/2004 |
| JP | 2007-124769 A | 5/2007 |
| JP | 2011-217548 A | 10/2011 |
| JP | 2011-217550 A | 10/2011 |
| JP | 2011-229298 A | 11/2011 |

OTHER PUBLICATIONS

Extended European Search Report issued in counterpart European Application No. 13846924.2 dated May 4, 2016 (Eight (8) pages).

* cited by examiner

POWER CONVERSION DEVICE WITH FLOW CONDUITS FOR COOLANT

TECHNICAL FIELD

The present invention relates to a power conversion device that converts DC power into AC power or that converts AC power into DC power, and in particular relates to such a power conversion device that is suitable for being mounted to a vehicle.

BACKGROUND ART

Along with demands for making hybrid automobiles and electric automobiles more compact, there is also a demand for reducing the size of components used in such automobiles, such as power conversion devices. Now, by mounting such a power conversion device to a vehicle component such as a transmission or a motor or the like, it is possible to reduce the system cost including the cost of the power conversion device, and to make the system more compact. However, if such a vehicle component to which a power conversion device is mounted is a component that generates heat, then it is necessary to solve thermal problems of components mounted to the power conversion device, such as a capacitor module for smoothing, since the power conversion device receives heat generated by the vehicle component and accordingly the temperature of the cooling water for the power conversion device and its surrounding temperature become high. In this connection, in Patent Document #1, a flow conduit defining member in which a coolant flow conduit for conducting coolant is defined is provided within a metallic housing, so that components that are mounted to the power conversion device are protected from heat transmitted from a vehicle component such as a transmission or a motor-generator.

However, under the supposition that the power conversion device is mounted to some vehicle component, there is a requirement for making more compact and for reducing the space further by employing a construction in which the device is matched to the shape of the vehicle component, which may for example be circular.

CITATION LIST

Patent Literature

Patent Document #1: Japanese Laid-Open Patent Publication 2011-217548.

SUMMARY OF INVENTION

Technical Problem

The object of the present invention is to provide a power conversion device that can be made more compact without degradation of its cooling performance.

Solution to Problem

The power conversion device according to the present invention is a power conversion device comprising: a power semiconductor module that converts DC current to AC current; a capacitor that smoothes DC power; a first flow conduit defining member that defines a first flow conduit, and that also defines a first storage space in which the power semiconductor module is housed; and a second flow conduit defining member that defines a second flow conduit, and that also defines a second storage space in which the capacitor is housed; and characterized in that: the first flow conduit defining member and the second flow conduit defining member are arranged so that, when viewed from above the power conversion device, a projecting portion of the first flow conduit defining member and a projecting portion of the second flow conduit defining member do not overlap; the first flow conduit defining member is disposed beneath a plane that coincides with the lower surface of the second flow conduit defining member; and a first space, in which a vehicle component that is different from the power conversion device is disposed, is defined in a space to the side of the first flow conduit defining member and moreover below the second flow conduit defining member.

Advantageous Effects of Invention

According to the present invention, by adopting a configuration in which structural components that are mounted to the power conversion device such as a power semiconductor module and a capacitor and so on are arranged along a circular shape and are shifted vertically, and by, at the same time, arranging a flow conduit defining member that houses these components, for which the cooling function is very important, along a circular shape in the same way, it becomes possible to make the whole including a vehicle component more compact, without degradation of its cooling performance.

DESCRIPTION OF EMBODIMENT

In the following, an embodiment of the power conversion device according to the present invention will be explained with reference to the drawings. It should be understood that the same reference symbols are appended to elements in the figures that are the same, and duplicated explanation is omitted.

The power conversion device 200 according to this embodiment is principally used in a hybrid automobile or an electric automobile. An example of such a vehicle system is described in Japanese Laid-Open Patent Publication 2011-217550. It should be understood that the power conversion device 200 according to this embodiment could also be used in some other application in order to obtain beneficial effects. For example, this power conversion device could be used in a consumer-type electrical inverter for a refrigerator or for an air conditioner, with the objective of enhancing productivity and enhancing cooling performance. Furthermore, it could also be used in an inverter for an industrial machine whose conditions of use are similar to those of an inverter for a vehicle.

Figure 1:
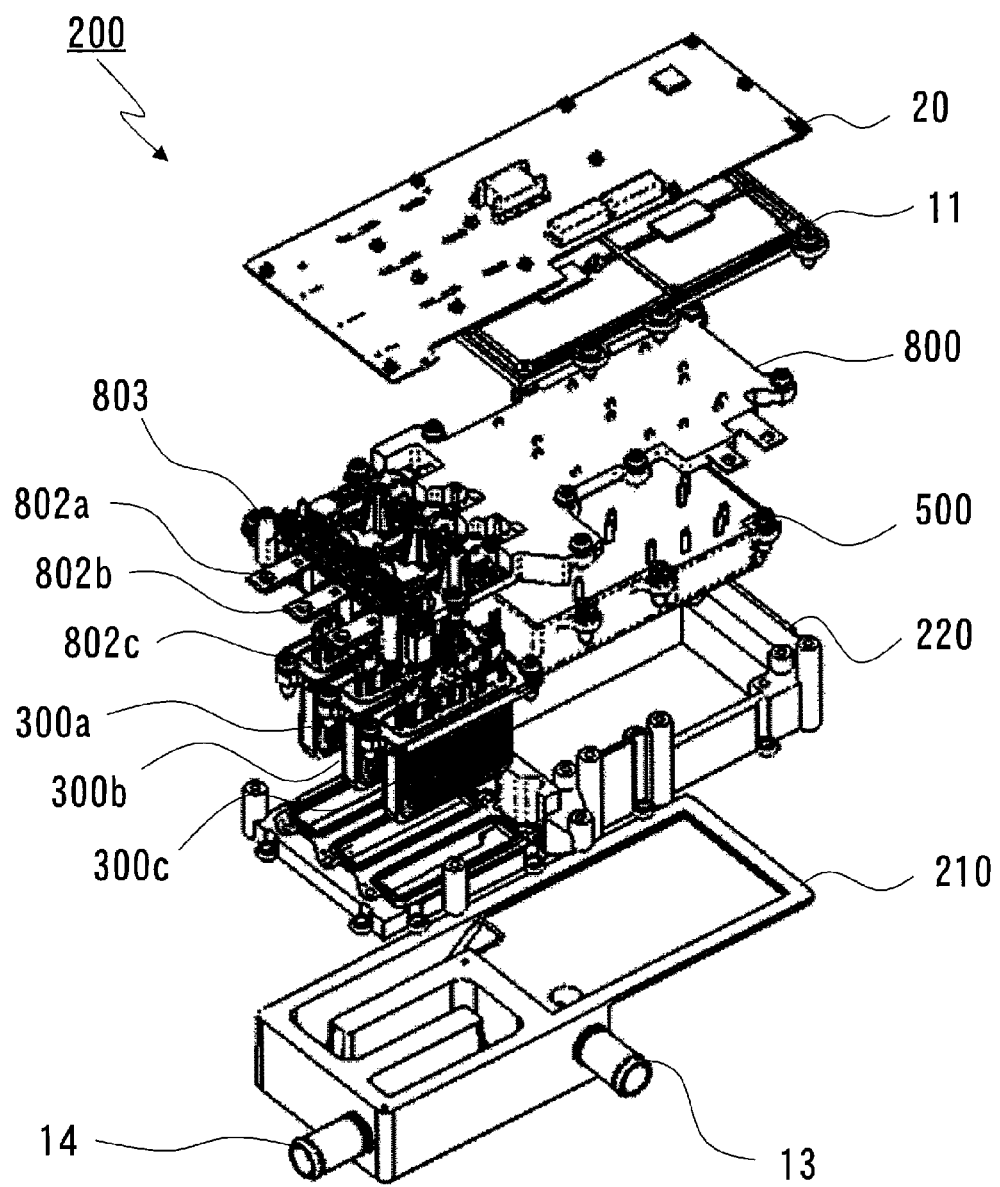
FIG. 1 is an exploded perspective view of the structural components of a power conversion device 200, for explanation of the overall structure thereof.

FIG. 1 is an exploded perspective view of the structural components of the power conversion device 200 according to this embodiment, for explanation of the overall structure thereof. This power conversion device 200 comprises a circuit board 20, a metallic base plate 11, a bus bar assembly 800, power semiconductor modules 300a through 300c, and a capacitor module 500. These members are housed in a first case 210 and a second case 220.

The power semiconductor modules 300a through 300c, which will be described hereinafter, convert DC power into AC power. And the capacitor module 500, which will be described hereinafter, smooths the DC power. A drive circuit portion that outputs drive signals that drive the power semiconductor modules 300a through 300c is mounted to the circuit board 20, and will be described hereinafter. Moreover, a control circuit portion that outputs control signals to the drive circuit for controlling the power semiconductor modules 300a through 300c is mounted to the circuit board 20, and will be described hereinafter. Examples of these circuit systems are described in Japanese Laid-Open Patent Publication 2011-217550.

The first case 210 is arranged at the lowermost portion of the power conversion device 200. And the second case 220 is disposed at a portion above the first case 210. While this matter will be described hereinafter, this first case 210 and this second case 220 together constitute a flow conduit (passage or channel) defining assembly in which coolant flows are defined for cooling the power semiconductor modules 300a through 300b and the capacitor module 500.

The bus bar assembly 800 comprises a DC side conductor plate, AC terminals 802a through 802c and support members for supporting the above components, and also comprises a current sensor 803. The DC side conductor plate transmits DC power from the capacitor module 500 to the power semiconductor modules 300a through 300c. The power that has been converted to AC by the power semiconductor modules 300a through 300c is outputted from the AC terminals 802a through 802c. The AC terminals 802a through 802c are arranged to pass through holes in the current sensor 803.

Figure 2A:
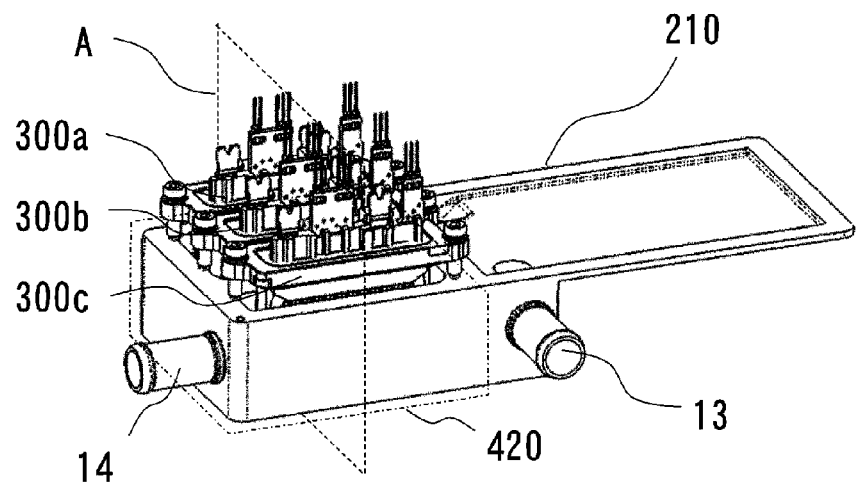
FIG. 2(a) is a perspective view showing a situation in which power semiconductor modules 300a through 300c are housed in a first flow conduit defining member 420.
Figure 2B:
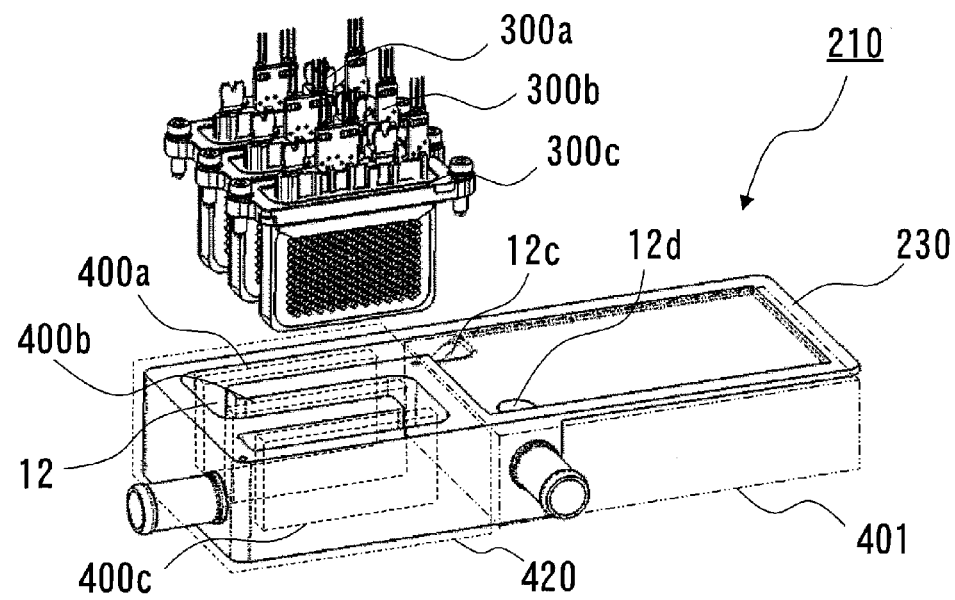
FIG. 2(b) is a perspective view showing a situation in which the power semiconductor modules 300a through 300c are separated from the first flow conduit defining member 420.

The structures of the power semiconductor modules 300a through 300c and of a first flow conduit defining member 420 that is formed in the first case 210 will now be explained using FIG. 2. FIG. 2(a) is a perspective view showing a situation in which the power semiconductor modules 300a through 300c are housed in this first flow conduit defining member 420. And FIG. 2(b) is a perspective view showing a situation in which the power semiconductor modules 300a through 300c are separated from the first flow conduit defining member 420.

An inlet conduit 13 for inflow of coolant and an outlet conduit 14 for discharge of coolant are formed in the first case 210. Moreover, the first case 210 incorporates the first flow conduit defining member 420 and a first lid portion 230. The first lid portion 230 closes under a concaved portion formed in the lower surface of the second case 220 that will be described hereinafter, and functions as a coolant flow conduit defining member. A flow conduit junction portion 12c and a flow conduit inlet portion 12d that will be described hereinafter are formed in the first lid portion 230.

The first flow conduit defining member 420 has a first storage space 400 in which the power semiconductor modules 300 are housed. In this embodiment, first storage spaces 400a, 400b, and 400c that respectively correspond to the power semiconductor modules 300a, 300b, and 300c are defined in this first storage space 400. Furthermore, via flow conduit doubling back portions, these first storage spaces 400a, 400b, and 400c define, in series, a first flow conduit 12.

Moreover, a first space 401 is defined at a side portion of the first flow conduit defining member 420. The inlet conduit 13 and the flow conduit connection portion 12c are defined in a region within this first space 401. And the flow conduit inlet portion 12d, which connects to the inlet conduit 14, is defined in the lid portion 230. Moreover, the outlet conduit 14, which connects to the first flow conduit 12, is formed in the first flow conduit defining member 420.

Figure 3:
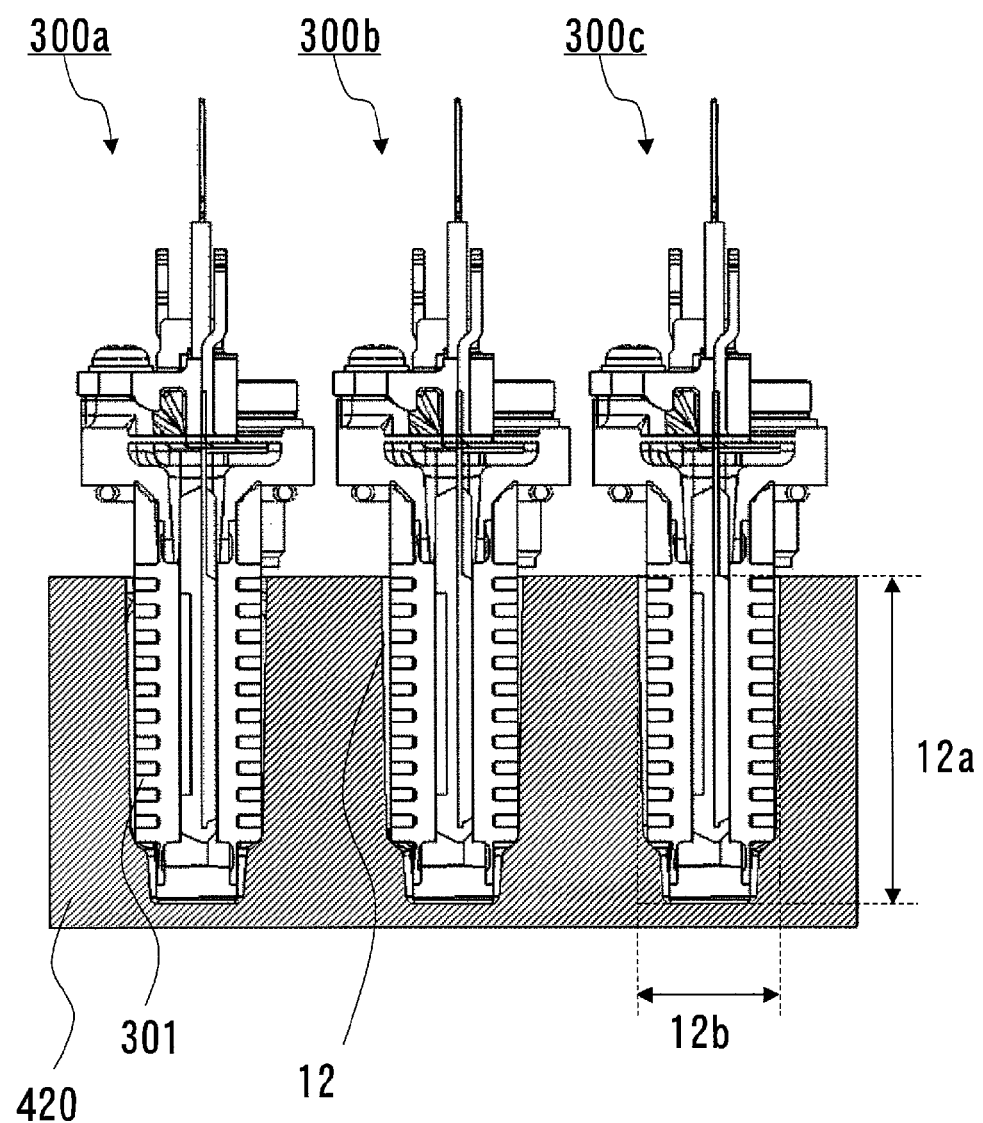
FIG. 3 is a sectional view of the power semiconductor modules 300 and the flow conduit defining member 420 in a cross section A taken as shown in FIG. 2.

FIG. 3 is a sectional view of the power semiconductor modules 300 and the flow conduit defining member 420 in a cross section A taken as shown in FIG. 2. As shown in FIG. 2 and FIG. 3, in this embodiment, the three power semiconductor modules 300 are inserted into the first flow conduit 12 that is defined in the first flow conduit defining member 420. The first flow conduit 12 is formed so that its depth 12a is greater than its width 12b.

The power semiconductor modules 300 include power circuit members that include power semiconductor elements. For example insulated gate type bipolar transistors or diodes may be used as these power semiconductor elements. Moreover, the power semiconductor modules 300 are formed in generally flattened shapes, and have heat dissipation portions 301 on both their sides, on which cooling fins are formed. Insulating members are disposed between the power circuit members and the heat dissipation portions 301. The heat dissipation portions 301 are formed so as to oppose the power circuit members. Since the heat dissipation portions 301 of the power semiconductor modules 300 are directly in contact with the coolant flowing in the first conduit 12, accordingly the power semiconductor modules 300, which are received in the first flow conduit 12, are cooled with good efficiency.

Figure 4A:
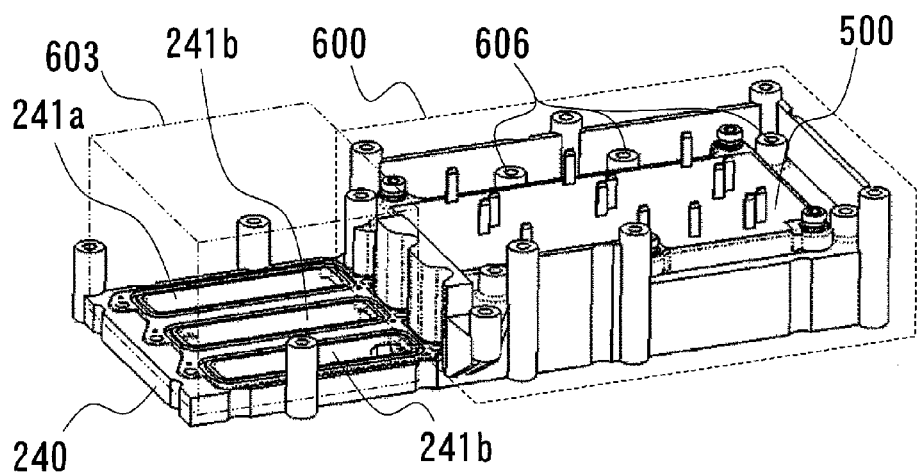
FIG. 4(a) is a perspective view showing a situation in which a capacitor module 500 is housed in a second flow conduit defining member 600.
Figure 4B:
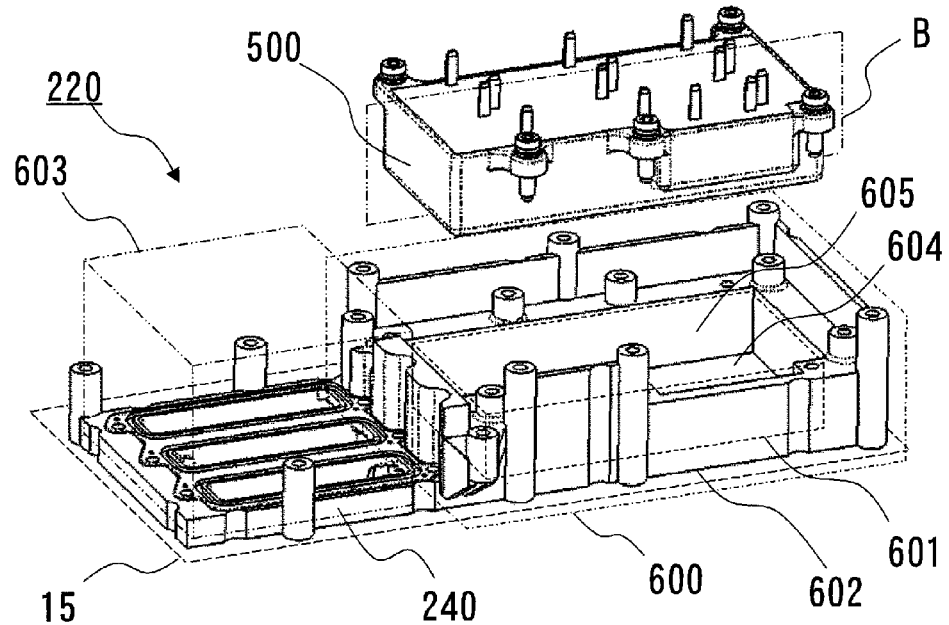
FIG. 4(b) is a perspective view showing a situation in which the capacitor module 500 has been separated from the second flow conduit defining member 600.

The structure of the capacitor module 500 and of the second flow conduit defining member 600, which is formed in the second case 220, will now be explained with reference to FIG. 4. FIG. 4(*a*) is a perspective view showing a situation in which the capacitor module 500 is housed in the second flow conduit defining member 600. And FIG. 4(*b*) is a perspective view showing a situation in which the capacitor module 500 has been separated from the second flow conduit defining member 600.

The second case 220 incorporates the second flow conduit defining member 600 and a second lid portion 240. Opening portions 241*a* through 241*c* are formed in the second lid portion 240 for insertion of the power semiconductor modules 300*a* through 300*c* respectively. The power semiconductor module 300*a* is inserted into the opening portion 241*a*. The power semiconductor module 300*b* is inserted into the opening portion 241*b*. And the power semiconductor module 300*c* is inserted into the opening portion 241*c*.

The second flow conduit defining member 600 defines a second storage space 601 that receives the capacitor module 500. As will be described hereinafter, this second storage space 601 is a space that is defined by a bottom surface portion 604 and side wall portions 605, and is cooled by coolant flowing in the interior of the bottom surface portion 604 and the side wall portions 605. The lower surface 602 of the second flow conduit defining member 600 is made as a planar surface, and is disposed so as to fit tightly against the first lid portion 230 formed on the first case 210 with no clearance remaining between them. Here, a plane that coincides with the lower surface 602 of the second flow conduit defining member is denoted by the reference symbol 15.

Furthermore, support members 606 are formed at the edges of the side wall portions 605 that define the second storage space 601. These support members 606 are members for supporting the DC side conductor plate, and are formed so as to project upward. It should be understood that, in FIG. 4, the reference symbol 606 is only appended to some of these support members.

A second space 603 is defined above the second lid portion 240, in other words at the side of the second flow conduit defining member 600. As will be described hereinafter, a drive circuit portion of the circuit board 20 and the current sensor 803 are disposed in this second space 603.

Figure 5:
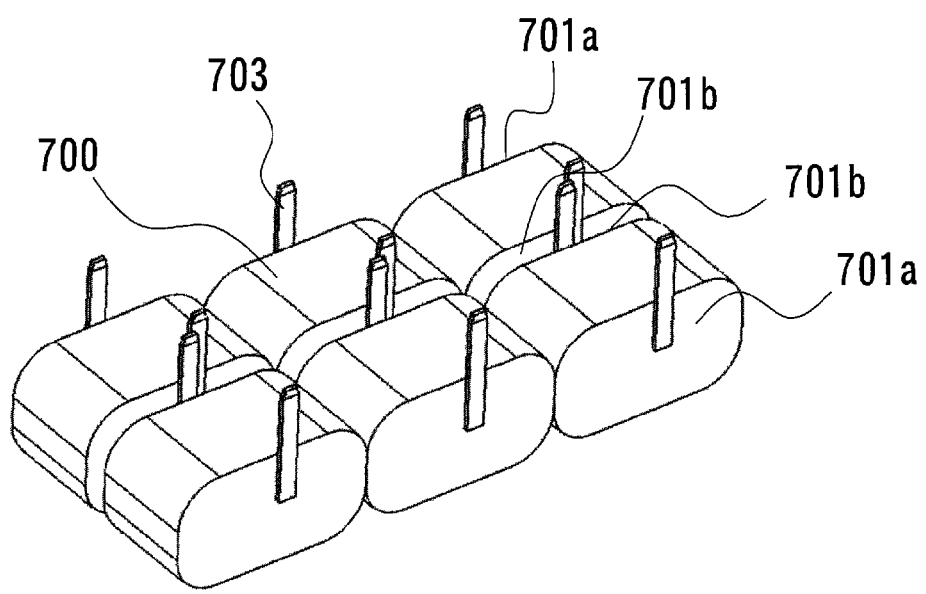
FIG. 5 is a perspective view of capacitor cells 700.

FIG. 5 is a perspective view of film capacitor cells 700, which are disposed within the capacitor module 500. In this embodiment, the capacitor module 500 incorporates six film capacitor cells 700. Each of these film capacitor cells 700 has a first electrode 701*a* on one surface and a second electrode 701*b* on another surface. Pairs of the film capacitor cells 700 are arranged so that their respective second electrodes 701*b* mutually oppose one another. Each two film capacitor cells 700 whose second electrodes 701*b* thus oppose one another constitute one pair, and three similar pairs of film capacitor cells 700 are thus constituted, so that a total of six film capacitor cells 700 are employed. It becomes possible further to simplify the construction for insulation countermeasures by arranging the electrodes of the film capacitor cells 700 so that the poles of either their positive electrodes or their negative electrodes oppose one another closely.

Lead terminals 703 are connected to the first electrodes 701*a* and to the second electrodes 701*b*. And the first electrodes 701*a* and the second electrodes 701*b* are connected to the DC side conductor plate via these lead terminals 703.

Figure 6:
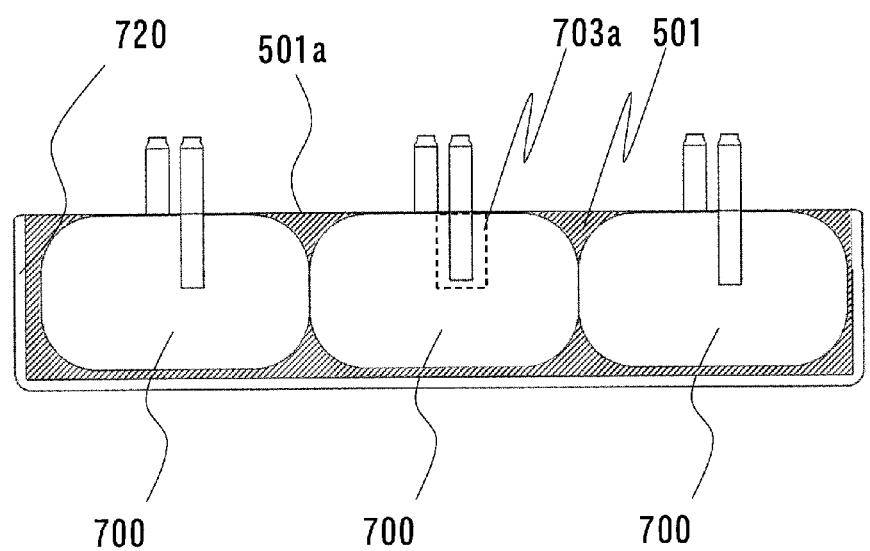
FIG. 6 is a sectional view of the capacitor module 500 in a cross section B taken as shown in FIG. 4.

FIG. 6 is a sectional view of the capacitor module 500 in a cross section B taken as shown in FIG. 4. The film capacitor cells 700 are housed in a capacitor case 720, and this is filled with a sealing material 501. The lead terminals 703 are formed so as to project from the exposed surface 501*a* of the sealing material 501. Portions 703*a* of the lead terminals are sealed within the sealing material 501. In other words, the lead terminals 703 all project in the same direction out from one of the surfaces of the capacitor module 500, i.e. out from its upper surface.

Figure 7:
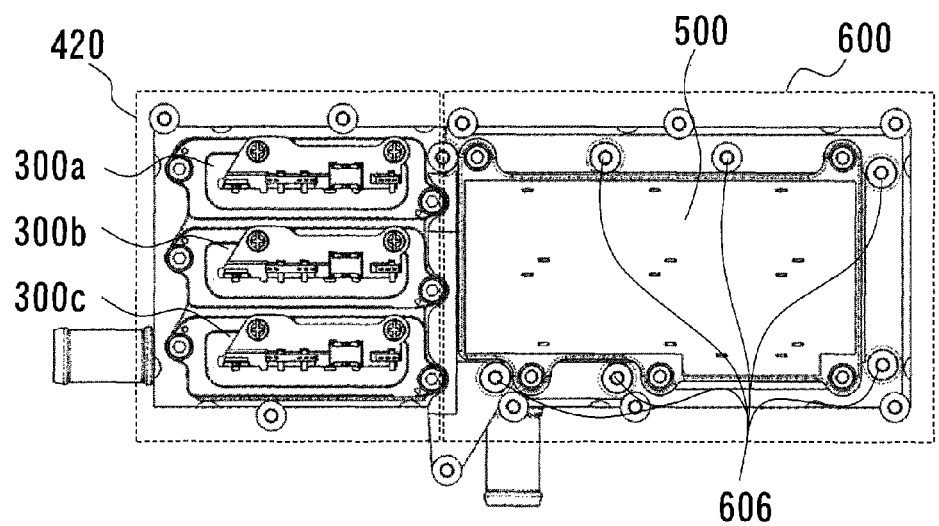
FIG. 7 shows a plan view of an assembly of a first case 210 shown in FIG. 2 and a second case 220 shown in FIG. 4.

FIG. 7 shows a plan view of an assembly of the first case 210 shown in FIG. 2 and the second case 220 shown in FIG. 4. FIG. 7 is also a plan view showing the situation in which the circuit board 20, the metallic base plate 11, and the bus bar assembly 800 have been removed from the power conversion device 200. A projecting portion 421 of the first flow conduit defining member 420 and a projecting portion 621 of the second flow conduit defining member 600 are shown in FIG. 7. As shown in FIG. 7, the projecting portion 421 of the first flow conduit defining member 420 and the projecting portion 621 of the second flow conduit defining member 600 are arranged so that they do not overlap. In other words, the flow conduit for cooling the power semiconductor modules and the flow conduit for cooling the capacitor module are arranged so that they do not overlap in the vertical direction.

Figure 8:
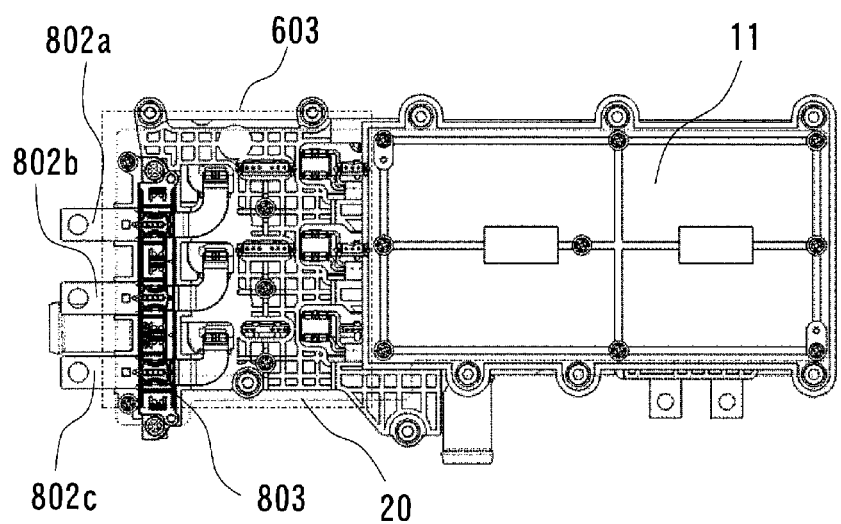
FIG. 8 is a plan view showing a situation in which, in the state shown in FIG. 7, a bus bar assembly 800 and a metallic base plate 11 have been attached.

FIG. 8 is a plan view showing a situation in which, in the state shown in FIG. 7, the bus bar assembly 800 and the metallic base plate 11 have been attached. Moreover, in order to show the arrangement of the bus bar assembly 800 and the metallic base plate 11, the circuit board 20 itself is not shown in this figure; rather, only framing lines for showing the position of arrangement of the circuit board 20 are shown. The second space 603 is a space above the first flow conduit defining member 420. The bus bar assembly 800 is disposed so that a portion of that bus bar assembly 800 is positioned in this second space 603. The current sensor 803 is also provided in this second space 603. And the metallic base plate 11 is fixed to the second flow conduit defining member 600 by a technique such as, for example screw fixing or the like.

In the power conversion device 200 of this embodiment, the DC side conductor plate is not a structure integrated with the capacitor module 500, but is separate therefrom. By providing an air layer between the DC side connector plate and the capacitor module 500 in this manner, a construction is provided in which heat generated in the DC side conductor plate, which is the main cause for transmission of heat to the capacitor module 500, cannot easily be transmitted to the capacitor module 500. The rated temperature of the film capacitor cells 700 for smoothing is low, as compared to those of the other components that are mounted to the power conversion device 200. If the temperature of the film capacitor cells 700 becomes higher than their rated temperature, then the life of the film capacitor cells 700 abruptly decreases, and they cannot fulfill their function as smoothing capacitors. Due to this, enhancement of the performance for cooling the capacitor module 500 is a very important problem. As will be described hereinafter, in this embodiment, a bottom surface flow conduit portion 16*a* is formed under the capacitor module 500, so that it is possible to suppress the influence of transmitted heat transmitted vertically to the capacitor module 500, whose rated temperature is lower than those of the other components.

Figure 9:
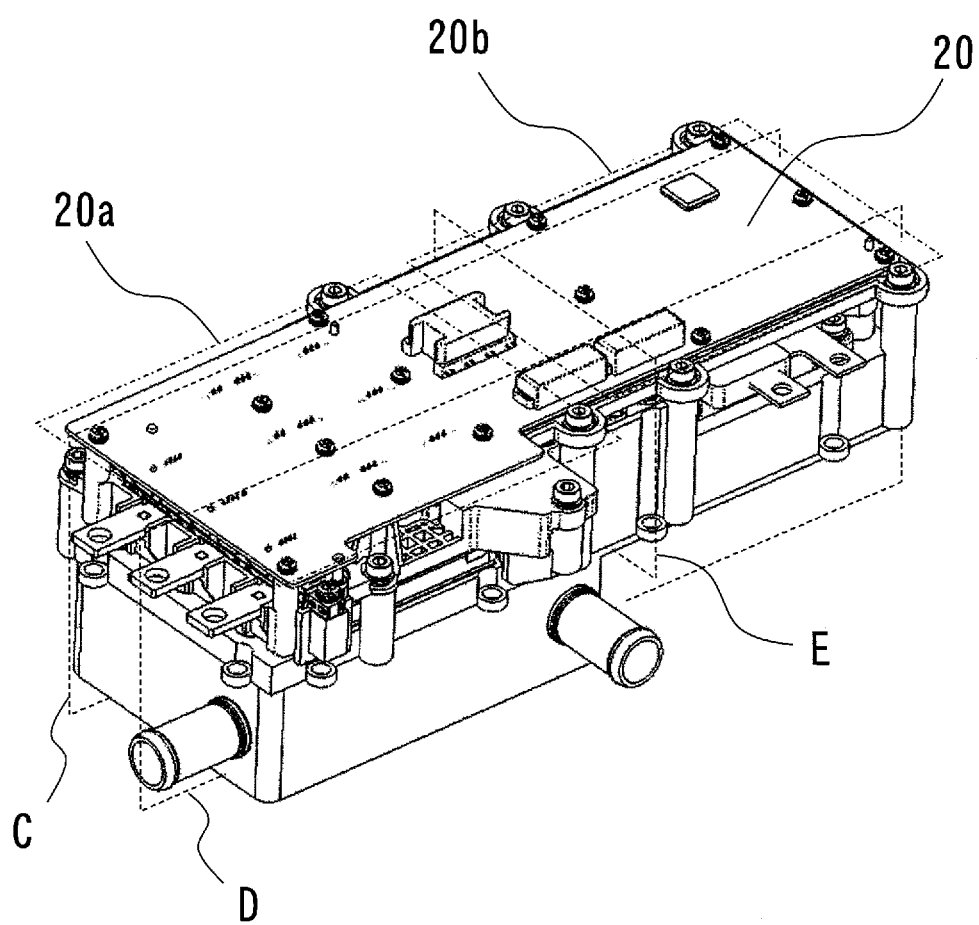
FIG. 9 is an external perspective view for explanation of the overall structure of this power conversion device 200.

FIG. 9 is a perspective view for explanation of the overall structure of this power conversion device 200, and is a perspective view showing a situation in which the circuit board 20 has been attached in the state shown in FIG. 8. The circuit board 20 is installed above the metallic base plate 11 and the bus bar assembly 800. In other words, the circuit board 20 is disposed so as to oppose the first flow conduit defining member 420 and the second flow conduit defining member 600.

As previously described, the circuit board 20 comprises the drive circuit portion 20a that outputs drive signals that drive the power semiconductor modules 300a through 300c, and the control circuit portion 20b that outputs control signals to the drive circuit for controlling the power semiconductor modules 300a through 300c. The drive circuit portion 20a is disposed in a region that opposes the first storage space 400 in which the power semiconductor module 300 is housed. And the control circuit portion 20b is disposed in a region that opposes the second storage space 601 in which the capacitor module 500 is housed.

Since it becomes possible to shorten the connection distances between the power semiconductor modules 300 and the drive portion 20a by disposing the drive circuit portion 20a so as to oppose the power semiconductor modules 300, accordingly the beneficial effects of prevention of increase of the parasitic inductances and of suppression of noise are obtained. Moreover, by separating the drive circuit portion and the control circuit portion onto separate circuit boards, there is the beneficial effect of making it difficult for noise generated by the drive circuit portion to be transmitted to the control circuit portion. Furthermore, by mounting the drive circuit portion 20a and the control circuit portion 20b on the single circuit board 20, it becomes possible to reduce the height of the power conversion device.

As shown in FIG. 7, in the power conversion device according to this embodiment, the first flow conduit defining member 420 in which the power semiconductor modules 300 are housed and the second flow conduit defining member 600 in which the capacitor module 500 is housed are arranged so that their respective projecting portions do not overlap, when viewed from above the power conversion device. Moreover, taking the lower surface 15 of the second flow conduit defining member as a boundary, the first flow conduit defining member 420 is disposed below this boundary, while the second flow conduit defining member 600 is disposed above it. By employing a structure of this type, the first space 401 is defined in the region to the side of the first flow conduit defining member 420 and moreover below the second flow conduit defining member 600.

Figure 10:
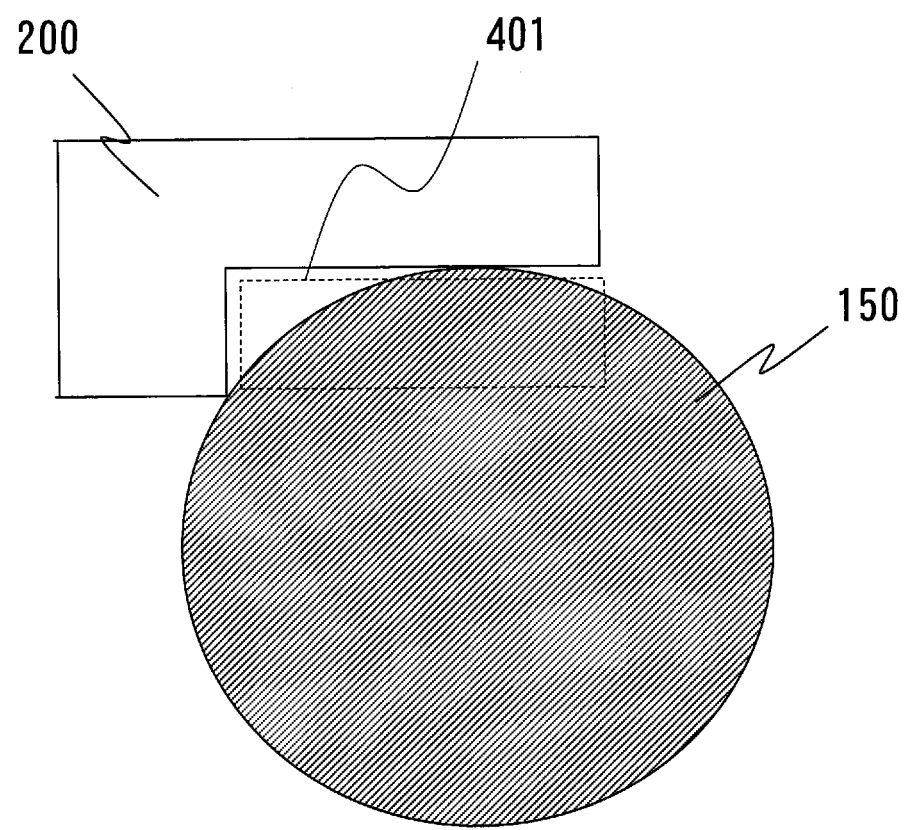
FIG. 10 is a schematic figure for explanation of how a vehicle component 150 and the power conversion device 200 are arranged.

FIG. 10 is a schematic figure for explanation of how some vehicle component 150 and this power conversion device 200 are arranged. For example, a transmission or a motor or the like may be cited as an example of such a vehicle component 150. By disposing the circular vehicle component 150 in the first space, it becomes possible to reduce the gap between the vehicle component 150 and the power conversion device 200, thus making the assembly more compact. Moreover, in this power conversion device 200, by providing flow conduit defining members for both the power semiconductor modules 300 and also the capacitor module 500, both of which both require cooling, it is possible to suppress the influence of transmitted heat from the vehicle component 150, so that the reliability is enhanced.

Furthermore, in this embodiment, the first flow conduit defining member 420 of the power conversion device 200 is high in the vertical direction, whereas the second flow conduit defining member 600 has a shape that is low in the vertical direction. The first flow conduit 12 is defined in the first flow conduit defining member 420 so that its depth is greater than its width, and the power semiconductor modules 300 are housed in this first flow conduit 12. With this type of structure, while it becomes possible to build the power conversion device 200 so as to follow a circular shape more closely, it also becomes possible to ensure a good coolant flow conduit area for the power semiconductor modules 300, which, among the components of the power conversion device, are the ones that generate the most heat.

Figure 11:
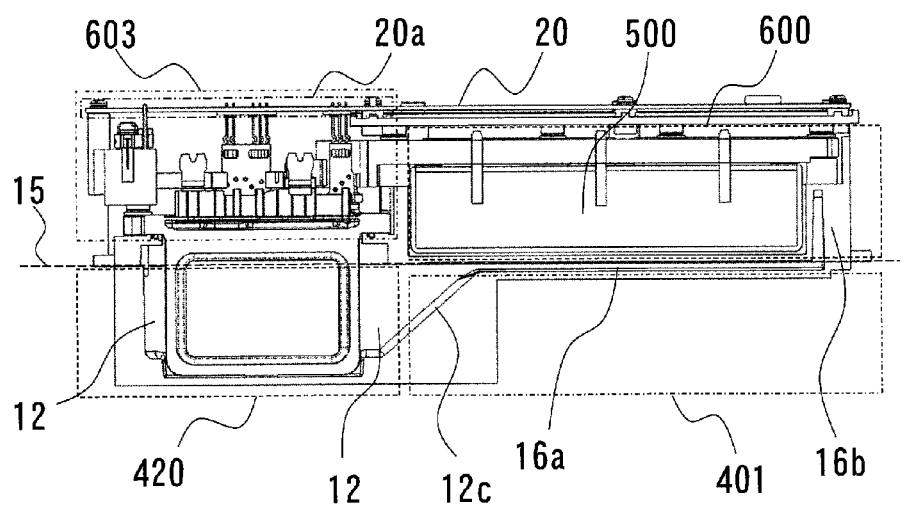
FIG. 11 is a sectional view of the power conversion device 200 in a cross section C taken as shown in FIG. 9.

FIG. 11 is a sectional view of the power conversion device 200 in a cross section C taken as shown in FIG. 9. The first flow conduit defining member 420 and the first space 401 are formed below the plane 15 that coincides with the lower surface of the second flow conduit defining member 600. And the second flow conduit defining member 600 and the second space 603 are formed above the plane 15 that coincides with the lower surface of the second flow conduit defining member 600. And the first space 401 is defined in a space at the side of the first flow conduit defining portion 420 and moreover below the second flow conduit defining member 600. Yet further, the second space 603 is a space above the first flow conduit defining member 420.

The bottom surface flow conduit portion 16a is formed in the region between the capacitor module 500 and the first space 401. This bottom surface flow conduit portion 16a is formed and is defined by a concave portion that is formed on the first lid portion 230 of the first case 210 and a concave portion that is formed on the lower surface of the second flow conduit defining member 602. A side wall flow conduit portion 16b that connects to the bottom surface flow conduit portion 16a is defined at the side of the capacitor module 500. This bottom surface flow conduit portion 16a and side wall flow conduit portion 16b are flow conduits that are defined by the second flow conduit defining member 600, and that together define the second flow conduit 16.

The first flow conduit 12 is connected to the second flow conduit 16 via the flow conduit connection portion 12c. This flow conduit connection portion 12c is formed so as to pass through the first space 401. Moreover, as previously described, the circuit board 20 is disposed in a region that opposes the first storage space 400, in other words is disposed in the second space 603. In particular, the drive circuit portion 20a of the circuit board 20 is disposed in the second space 603.

By the flow conduit connection portion 12c that joins the first flow conduit 12 and the second flow conduit 16 being connected from the lower surface of the second flow conduit defining member 600 to the first flow conduit defining member 420, it becomes possible to form a flow conduit between the second flow conduit defining member 600 and the first flow conduit defining member 420. Due to this, it becomes possible to prevent heat that is transmitted from the vehicle component 150 from flowing through between the second flow conduit defining member 600 and the first flow conduit defining member 420 into the circuit board 20 that defines the second space 603, which is the space above the first flow conduit defining member 420.

Figure 12:
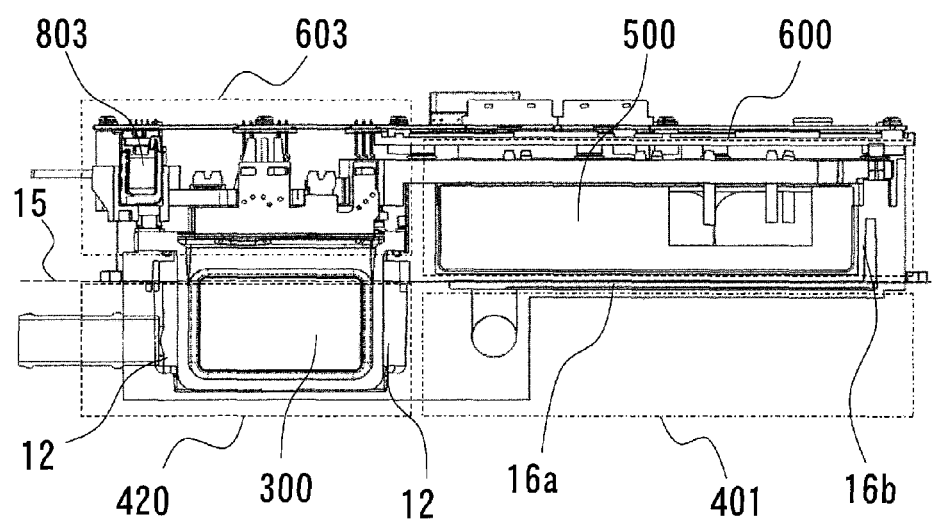
FIG. 12 is a sectional view of the power conversion device 200 in a cross section D taken as shown in FIG. 9.

FIG. 12 is a sectional view of the power conversion device 200 in a cross section D taken as shown in FIG. 9. As previously described, the current sensor 803 is disposed in the second space 603. Since the current sensor 803 is not particularly resistant to heat, accordingly, by disposing it in the second space 603, it is possible to suppress the influence of heat transmitted from the vehicle component 150, so that it is possible to enhance the reliability.

Figure 13:
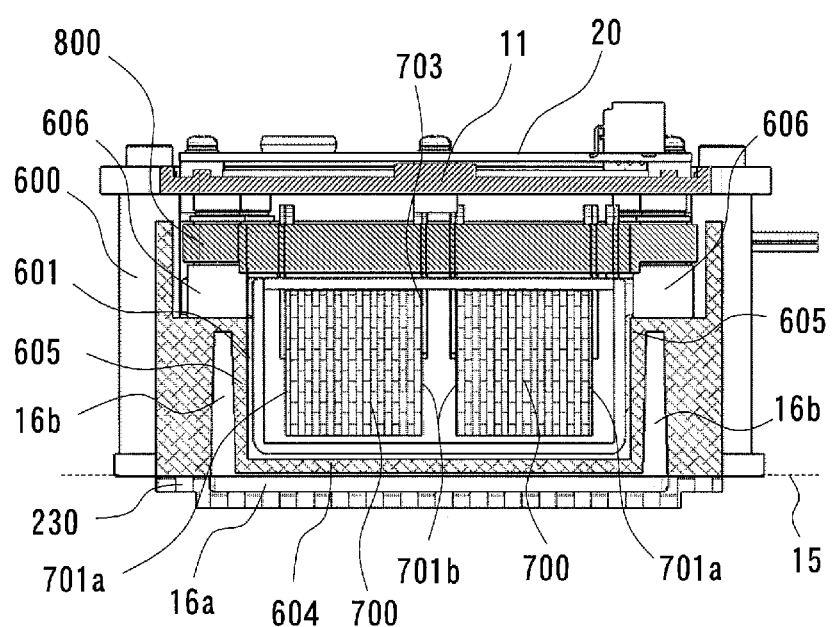
FIG. 13 is a sectional view of the power conversion device 200 in a cross section E taken as shown in FIG. 9.

FIG. 13 is a sectional view of the power conversion device 200 in a cross section E taken as shown in FIG. 9. As shown in FIG. 11 through FIG. 13, the second storage space 601 in which the capacitor module 500 is housed is formed so as to oppose both the bottom surface flow conduit portion 16a and also the side wall flow conduit portion 16b. The bottom surface flow conduit portion 16a is defined between the bottom surface portion 604 of the second flow conduit defining member 600 and the first lid portion 230 of the first case 210. And the side wall flow conduit portion 16b is defined so as to oppose the second storage space 601, with the side wall portion 605 of the second flow conduit defining member being sandwiched between them. This side wall flow conduit portion 16b is formed in a groove shape, from the lower surface 602 of the second flow conduit defining member 600 to a region that opposes the capacitor module 500. Moreover, the film capacitor cells 700 within the capacitor module 500 are disposed so that the first electrodes 701a of those film capacitor cells 700 oppose the side wall flow conduit portion 16b.

The second flow conduit defining member 600 defines the bottom surface flow conduit portion 16a so that it opposes the first space 401 in which a component that generates heat is disposed. Since, due to this, the heat generated by this component that generates heat is conducted to the bottom surface flow conduit portion 16a, accordingly, with this structure, the heat generated by the heat generating component does not penetrate to the bottom surface of the capacitor module 500. Furthermore, the first electrode surfaces 701a and the second electrode surfaces 701b of the film capacitor cells 700 are installed so as to oppose the side wall flow conduit portion 16b. And, since generation of heat by the film capacitor cells 700 is the main cause of generation of heat in the DC side conductor plate, accordingly it becomes possible to cool the capacitor cells 700 more efficiently, due to the fact that the side wall coolant conduit portion 16b is formed so as to oppose the first electrode surfaces 701a and the second electrode surfaces 701b that are connected to the DC side conductor plate.

Moreover, the support members 606 are connected to the side wall portion 605. Accordingly the heat generated in the DC side conductor plate, which is the main cause of heat generation in the film capacitor cells 700, is transmitted via the support members 606 to the side wall portion 605. And, since the side wall flow conduit portion 16b is formed in the side wall portion 605, accordingly, due to this, the heat generated in the DC side conductor plate can be effectively removed to the coolant that is flowing in this flow conduit portion.

Furthermore, the DC side conductor plate that is included in the bus bar assembly 800 comprises a positive electrode side conductor plate, a negative electrode side conductor plate, and an insulating member. And the insulating member is disposed between the positive electrode side conductor plate and the negative electrode side conductor plate. Moreover, the regions of the positive side electrode side conductor plate other than those where the insulating member is disposed are covered over by the insulating member. And, similarly, the regions of the negative side electrode side conductor plate other than those where the insulating member is disposed are covered over by the insulating member.

The insulating member that covers over the DC side conductor plate is fixed to the support members 606, for example by being bolted thereto. Accordingly, via the support members 606, the weight of the DC side conductor plate is borne by the second flow conduit defining member 600. Due to this, it is possible to prevent concentrations of stress acting upon contacting portions of the lead terminals 703 of the capacitor module 500 and the DC side conductor plate. And due to this, for example, it becomes possible to employ a welded construction for the junction portion, so that it becomes possible to make the structure more compact and to reduce the number of components thereof.

Yet further, the metallic base plate 11 is disposed between the second flow conduit defining member 600 and the circuit board 20. And this base plate 11 is fixed to the second flow conduit defining member 600. Accordingly, it is possible to prevent high-voltage noise from the capacitor module 500 and the DC side conductor plate that are mounted to the second flow conduit defining member 600 from exerting an influence upon the circuit board 20, and in particular upon the control circuit portion 20b. Moreover, it becomes possible to keep the mass of the metallic plate to the necessary minimum, while still obtaining good cooling performance due to the fact that the heat generated by the electronic components, i.e. by the drive circuit portion 20a and the control circuit portion 20b, is conducted away to the second flow conduit defining member 600 via the metallic base plate 11, and while still performing elimination of noise.

Figure 14:
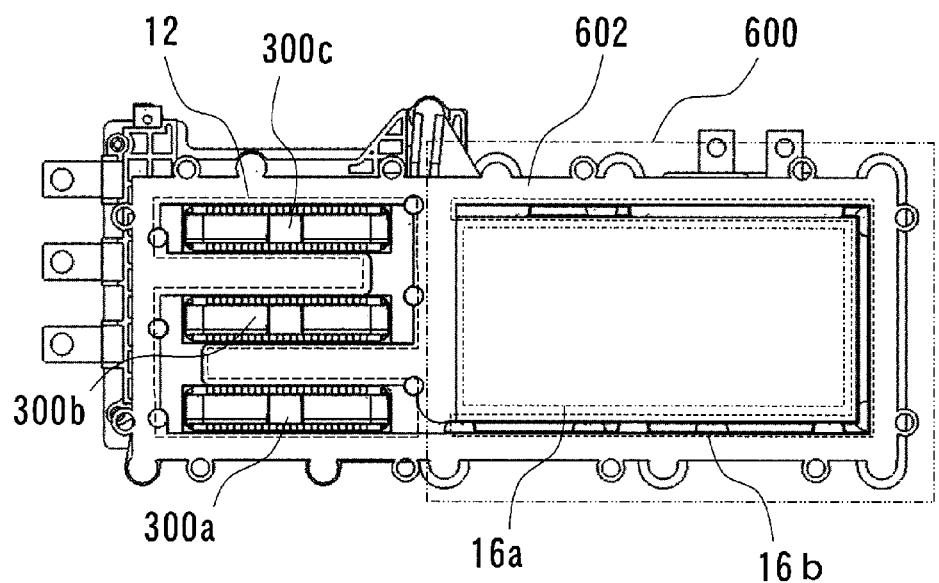
FIG. 14 is a bottom view of the power conversion device 200 with the first case 210 removed, for explanation of a second flow conduit 16 in the second flow conduit defining member 600.

FIG. 14 is a bottom view of the power conversion device 200 with the first case 210 removed, for explanation of the second flow conduit 16 in the second flow conduit defining member 600. The bottom surface flow conduit portion 16a and the side wall flow conduit portion 16b are defined on the lower surface 602 of the second flow conduit defining member 600. And the side wall flow conduit portion 16b is also defined by the square letter-C shape around the capacitor module 500. The coolant flows into the second flow conduit 16 through the flow conduit inlet portion 12d, and this flow branches into the bottom surface flow conduit portion 16a and the side wall flow conduit portion 16b. Thereafter, the coolant that is flowing in the bottom surface flow conduit portion 16a and the coolant that is flowing in the side wall flow conduit portion 16b flow into the first flow conduit 12 via the flow conduit connection portion 12c.

In this power conversion device, when the amount of heat in joules conducted from the power semiconductor to the first flow conduit portion 12 and the amount of heat conducted to the second flow conduit portion 16 from the capacitor module 150 are compared together, the former is the larger. Moreover, since there are thermal problems at the rated temperature of the film capacitor cells 700, accordingly, by flowing coolant from the second flow conduit portion 16 to the first flow conduit portion 12, it becomes possible to cool both of them with good balance.

REFERENCE SIGNS LIST

11: metallic base plate
12: first flow conduit
12a: depth of first flow conduit
12b: width of first flow conduit
12c: flow conduit connection portion
12d: flow conduit inlet portion
13: inlet conduit
14: outlet conduit
15: plane coincident with lower surface of second flow conduit defining member
16: second flow conduit
16a: bottom surface flow conduit portion
16b: side wall flow conduit portion
20: circuit board
20a: drive circuit portion
20b: control circuit portion
21: drive circuit portion
150: vehicle component
160: first space
200: power conversion device
210: first case
220: second case 230: first lid portion
240: second lid portion
241: opening portions
300: power semiconductor module
301: heat dissipation portion
320: power semiconductor element
400: first storage space
401: first space
420: first flow conduit defining member
421: projecting portion of first flow conduit defining member
500: capacitor
501: sealing material
501a: exposed surface
600: second flow conduit defining member
601: second storage space
602: lower surface of second flow conduit defining member
603: second space
604: bottom surface portion
605: side wall portion
606: support member
621: projecting portion of second flow conduit defining member
700: film capacitor cell
701a: first electrode surface
701b: second electrode surface
703: lead terminal
703a: portion of lead terminal
720: capacitor case
800: bus bar assembly
802: AC terminal
803: current sensor

The invention claimed is:

1. A power conversion device, comprising:
a power semiconductor module that converts DC current to AC current;
a capacitor that smooths DC power;
a first flow conduit defining member that defines a first flow conduit in which coolant flows, and that also defines a first storage space in which the power semiconductor module is housed;
a second flow conduit defining member that defines a second flow conduit in which coolant flows, and that also defines a second storage space in which the capacitor is housed;
a flow conduit connection portion that connects the first flow conduit and the second flow conduit; and
a circuit board comprising a drive circuit portion that drives the power semiconductor module, wherein:
a first space, in which a vehicle component that is different from the power conversion device is disposed, is defined in a space to a side of the first flow conduit defining member and below the second flow conduit defining member,
the circuit board is defined up to a second space, that is a space above the first flow conduit defining member, and
the flow conduit connection portion connects from the lower surface of the second flow conduit defining member to the first flow conduit defining member via the first space.

2. The power conversion device according to claim 1, wherein:
the power semiconductor module comprises a power circuit member that comprises a power semiconductor element;
the capacitor is housed in the second storage space;
the first flow conduit defining member is formed so that a depth of the first flow conduit is greater than a width of the first flow conduit; and
the power circuit member is housed in the first flow conduit.

3. The power conversion device according to claim 1, further comprising:
a current sensor that is disposed above the first flow conduit defining member.

4. The power conversion device according to claim 1, further comprising:
an inlet portion that connects to the second flow conduit; and
an outlet portion that connects to the first flow conduit.

5. The power conversion device according to claim 1, further comprising:
a DC side conductor plate that transmits the DC current flowing from the capacitor to the power semiconductor module;
a lead terminal that connects an electrode surface of the capacitor and the DC side conductor plate; and
a sealing material that seals a portion of the lead terminal and the capacitor, wherein:
the lead terminal projects from an exposed surface of the sealing material and is directly connected to the DC side conductor plate.

6. A power conversion device, comprising:
a power semiconductor module that converts DC current to AC current;
a capacitor that smooths DC power;
a first flow conduit defining member that defines a first flow conduit in which coolant flows, and that also defines a first storage space in which the power semiconductor module is housed; and
a second flow conduit defining member that defines a second flow conduit in which coolant flows, and that also defines a second storage space in which the capacitor is housed, wherein:
a first space, in which a vehicle component that is different from the power conversion device is disposed, is defined in a space to a side of the first flow conduit defining member and below the second flow conduit defining member,
the second flow conduit defining member defines the second storage space by a side wall portion and a bottom surface portion thereof;
the second flow conduit defining member further defines a side wall flow conduit portion that is defined to oppose the capacitor with the side wall portion being sandwiched therebetween, and a bottom surface flow conduit portion that is defined between the bottom surface portion and the vehicle component;
the capacitor is a film capacitor cell, and has a first electrode surface and a second electrode surface at two ends; and
the film capacitor cell is disposed so that the first electrode surface and the second electrode surface oppose the side wall portion.

7. The power conversion device according to claim 6, further comprising:
a DC side conductor plate that transmits the DC current flowing from the capacitor to the power semiconductor module; and
a support member for supporting the DC side conductor plate, wherein:
the support member is connected to the side wall portion.

8. The power conversion device according to claim 7, wherein:
the DC side conductor plate comprises a positive electrode side conductor plate, a negative electrode side conductor plate, and an insulating member that is disposed between the positive electrode side conductor plate and the negative electrode side conductor plate;
the insulating member covers over at least a portion of the positive electrode side conductor plate and at least a portion of the negative electrode side conductor plate; and
the insulating member is further connected to the support member.

9. A power conversion device, comprising:
a power semiconductor module that converts DC current to AC current;
a capacitor that smooths DC power;
a first flow conduit defining member that defines a first flow conduit in which coolant flows, and that also defines a first storage space in which the power semiconductor module is housed; and
a second flow conduit defining member that defines a second flow conduit in which coolant flows, and that also defines a second storage space in which the capacitor is housed; and
a circuit board that has a drive circuit portion that drives the power semiconductor module and a control circuit portion that controls the drive circuit portion, wherein:
a first space, in which a vehicle component that is different from the power conversion device is disposed, is defined in a space to a side of the first flow conduit defining member and below the second flow conduit defining member,
the circuit board is formed so as to oppose the first flow conduit defining member and the second flow conduit defining member,
the drive circuit portion is disposed in a region that opposes the first storage space, and
the control circuit portion is disposed in a region that opposes the second storage space.

10. The power conversion device according to claim 9, further comprising:
a metallic base plate that is disposed between the second flow conduit defining member and the circuit board, wherein:
the circuit board is mounted to the metallic base plate; and
the metallic base plate is fixed to the second flow conduit defining member.

11. A power conversion device, comprising:
a power semiconductor module that converts DC current to AC current;
a capacitor that smooths DC power;
a first flow conduit defining member that defines a first flow conduit in which coolant flows, and that also defines a first storage space in which the power semiconductor module is housed; and
a second flow conduit defining member that defines a second flow conduit in which coolant flows, and that also defines a second storage space in which the capacitor is housed, wherein:
a first space, in which a vehicle component that is different from the power conversion device is disposed, is defined in a space to a side of the first flow conduit defining member and below the second flow conduit defining member,
the first flow conduit defining member and the second flow conduit defining member are arranged so that, when viewed from above the power conversion device, a projecting portion of the first flow conduit defining member and a projecting portion of the second flow conduit defining member do not overlap, and
the first flow conduit defining member is disposed beneath a plane that coincides with a lower surface of the second flow conduit defining member.

* * * * *